(12) United States Patent
Shih

(10) Patent No.: US 6,530,067 B2
(45) Date of Patent: Mar. 4, 2003

(54) METHOD FOR SUBDIVIDING DATA OF A LAYOUT

(75) Inventor: Ming-Chih Shih, HsinChu (TW)

(73) Assignee: AnaGlobe Technology, Inc., HsinChu (TW)

( * ) Notice: Subject to any disclaimer, the term of this patent is extended or adjusted under 35 U.S.C. 154(b) by 82 days.

(21) Appl. No.: 09/852,682

(22) Filed: May 11, 2001

(65) Prior Publication Data

US 2002/0170025 A1 Nov. 14, 2002

(51) Int. Cl.[7] .............................................. G06F 17/50
(52) U.S. Cl. .................................. 716/7; 716/8; 716/11
(58) Field of Search ........................... 716/7, 8, 11, 15, 716/19, 20

(56) References Cited

U.S. PATENT DOCUMENTS

| | | | |
|---|---|---|---|
| 4,890,238 A | * 12/1989 | Klein et al. | 364/491 |
| 5,907,494 A | * 5/1999 | Dangelo et al. | 364/488 |
| 6,170,080 B1 | * 1/2001 | Ginetti et al. | 716/18 |
| 6,295,633 B1 | * 9/2001 | Murakawa | 716/8 |
| 2002/0124231 A1 | * 9/2002 | Teig et al. | 716/7 |

* cited by examiner

*Primary Examiner*—Tom Thomas
*Assistant Examiner*—Douglas W. Owens
(74) *Attorney, Agent, or Firm*—Birch, Stewart, Kolasch & Birch, LLP

(57) ABSTRACT

A method for subdividing data of a layout, which firstly divides the layout into a plurality of to-be-processed regions so that the number of entities of each to-be-processed region is smaller then a predetermined number, and calculating an image data amount and an geometric data amount of each to-be-processed region. Then the method selects a to-be-processed region from the plurality of to-be-processed regions as a selected region, and compares the image data amount of the selected region with the geometry data amount of the selected region. When the image data amount of the selected region is larger than the geometry data amount of the selected region, the method merges the selected region with its neighboring to-be-processed region to obtain a merged region and set the merged result as a selected region. When the image data amount of the selected region is smaller than the geometry data amount of the selected region, the method sets the selected region as a subdivision of the layout.

12 Claims, 4 Drawing Sheets

200

| IDA:10000 GDA:5000 | IDA:10000 GDA:17000 | IDA:20000 GDA:30000 | |
|---|---|---|---|
| IDA:10000 GDA:20000 | IDA:10000 GDA:15000 | | |
| IDA:20000 GDA:25000 | | IDA:5000 GDA:4000 / IDA:5000 GDA:6500 | IDA:10000 GDA:8500 |
| | | IDA:5000 GDA:6000 / IDA:5000 GDA:7000 | |
| | | IDA:10000 GDA:12000 | IDA:10000 GDA:15000 |

FIG. 2(A)

METHOD FOR SUBDIVIDING DATA OF A LAYOUT

BACKGROUND OF THE INVENTION

1. Field of Invention

The invention relates to a method for subdividing data of a layout according to the image data amount and geometry data amount.

2. Related Art

Along with the fast development in computer and network technology, to design various kinds of layout utilizing a network -based CAD (computer-aided design) system has become more and more popular. Take the IC design for example, to design the circuit layout in an IC utilizing a network -based CAD system not only reduces the design time required, but also speeds up the debug procedure. So, the overall layout-design efficiency can be improved.

Another advantage of utilizing a network -based CAD system is that when the layout becomes more and more complicated, a network -based CAD system allows multiple design engineers to design and modify a layout at the same time. Take the mask pattern layout for example, the number and data amount of a state-of-the-art mask pattern layouts has become larger as the structure of the modem VLSI becomes more and more complicated. The size of the file of a set of mask pattern layouts usually exceeds several megabytes. Such a huge and complex layout set must take multiple mask design engineers to design together. Utilizing a network-based CAD system, the data of the layouts can be stored in a database server, the mask-design application software can be stored in an application server, and the design engineers can modify the layouts at the same time using their computers connected with the database server and the application server. This architecture is known as a multi-tier network architecture.

However, because the geometric data amount of a layout is large, transmitting geometric data via network takes a lot of time and bandwidth. To solve this problem, in the prior art, the layout is subdivided into several portions evenly, for example, 4 or 16 regions. When a design engineer sends a request to the server, instead of transmitting all geometric data of a layout, the server only transmits image data of the region requested to the design engineer. This method ensures that each time the engineer sends a request to view an image of a region, only the image data of the region is transmitted, and the data amount transmitted on the network is the same (because all regions are of same image size).

However, since the above-mentioned method does not subdivide the layout according to its characteristics, it may still waste unnecessary transmission time. For example, one have ordinary skill in the art knows that one characteristic of an IC layout, a PCB layout or a mask pattern layout is that the entity density is not usually very even. If the layout is subdivided evenly, it is possible that the image data amount is much larger than the geometry data amount of a region. Under this circumstance, after spending time transmitting the image data, the engineer sees only few entities. This reduces both the designing and network-transmission efficiency.

SUMMARY OF THE INVENTION

It is an objective of the invention to provide a method for subdividing data of a layout, which can subdivide the layout according to its characteristics.

It is another objective of the invention to provide a method for subdividing data of a layout, which considers the geometry data amount and the image data amount of a layout when subdividing the same.

Pursuant to the above objectives, the method for subdividing data of a layout according to the invention firstly subdivides the layout into a plurality of to-be-processed regions so that the number of entities of each to-be-processed region is smaller then a predetermined number, and calculating an image data amount and an geometric data amount of each to-be-processed region. Then, the method selects a to-be-processed region from the plurality of to-be-processed regions as a selected region, and compares the image data amount of the selected region with the geometry data amount of the selected region. When the image data amount of the selected region is larger than the geometry data amount of the selected region, the method merges the selected region with its neighboring to-be-processed region to obtain a merged region and set the merged result as a selected region. When the image data amount of the selected region is smaller than the geometry data amount of the selected region, the method sets the selected region as a subdivision of the layout.

BRIEF DESCRIPTION OF THE DRAWINGS

The invention will become more fully understood from the detailed description given hereinbelow illustration only, and thus are not limitative of the invention, and wherein:

FIG. 2(A) to FIG. 2(C) are schematic views showing the implement conditions of the method for subdividing data of a layout according to a preferred embodiment of the invention. FIG. 2(A) shows the condition that the layout is subdivided into a plurality of to-be-processed regions. FIG. 2(B) shows the condition that two to-be-processed regions have merged to become a subdivision. FIG. 2(C) shows the condition of the layout after the procedure of the method according to the preferred embodiment of the invention is completed.

DETAILED DESCRIPTION OF THE INVENTION

The invention will be apparent from the following detailed description, which proceeds with reference to the accompanying drawings, wherein the same references relate to the same elements.

Figure 1:
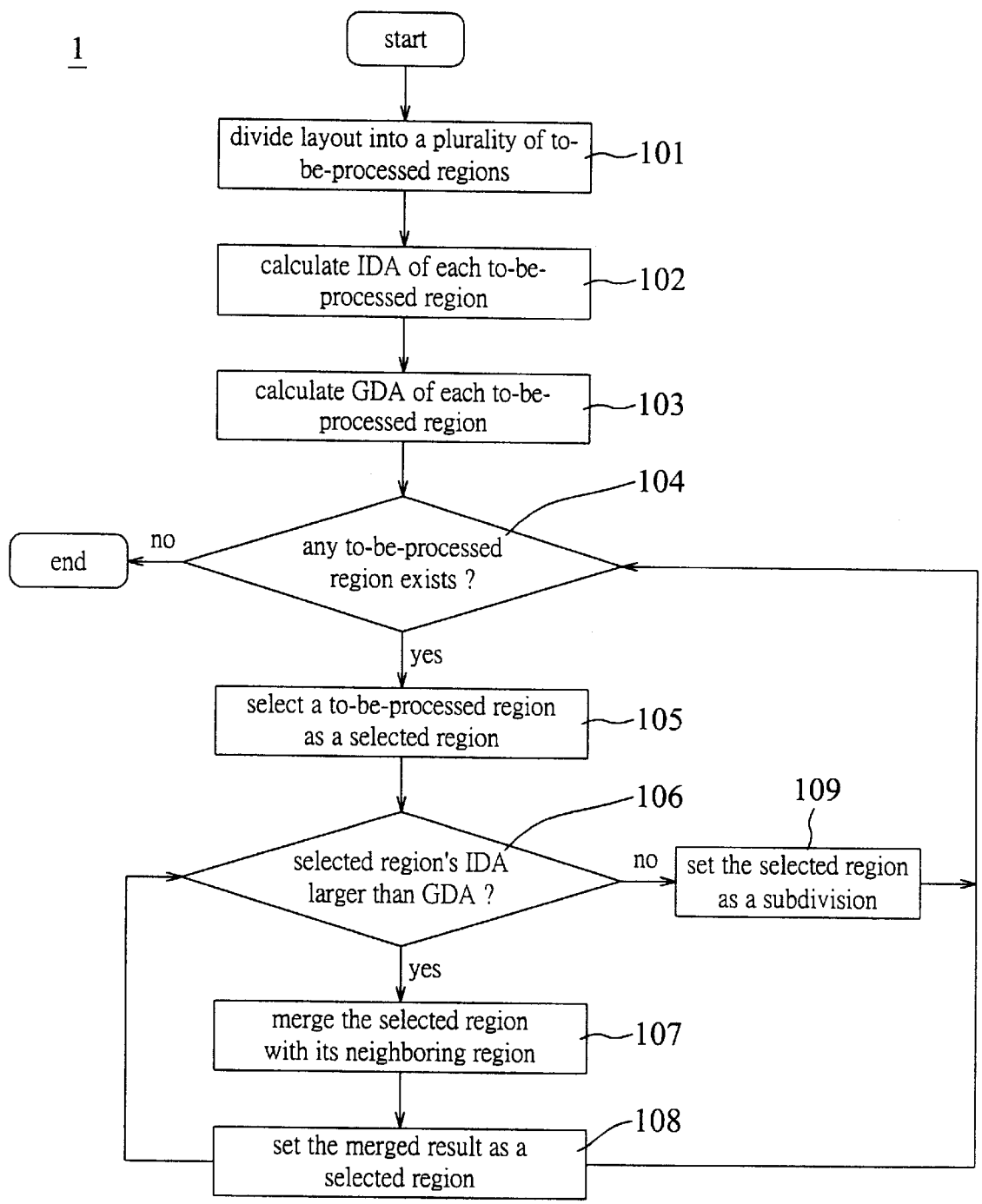
FIG. 1 is a flowchart showing the procedure flow of the method for subdividing data of a layout according to a preferred embodiment of the invention.

Referring to FIG. 1, the method for subdividing data of a layout 1 according to the preferred embodiment of the invention firstly divides the layout into a plurality of to-be-processed regions in procedure 101. Then, procedure 102 and procedure 103 calculates an image data amount (hereinafter referred to as IDA) and a geometric data amount (hereinafter referred to as GDA) of each to-be-processed region, respectively. For example, if the image size of a region is 200×200 pixels, and the data amount of a pixel is two bytes, then the IDA of the region is 40,000 bytes. Furthermore, if a region contains 100 entities and the entities are polygons with an average data amount of 60 bytes, then the GDA of the region is 6,000 bytes.

Referring to FIG. 2(A), in the preferred embodiment, procedure 101 subdivides the layout 200 into 13 regions by quad-tree algorithm according to the number of the entities (hereinafter referred to as NoE). That is, when the NoE of a region exceeds a threshold value, for example, 500 entities, procedure 101 will further subdivide this region into four smaller regions, until the NoE of the each region is small than the threshold value. In the preferred embodiment, "entity" means the object or shape appears in the layout. The more entities a region contains, the more image process time the region needs. The two numbers shown in each region in FIG. 2(A) denote the IDA and GDA of each region, respectively.

Referring back to FIG. 1, procedure 104 judges if there exists any to-be-processed region in the layout 200. When there is no to-be-processed region left then the whole procedure flow of the method 1 is over. If there is at least one to-be-processed region left, then method 1 selects a to-be-processed region as a selected region in procedure 105, and judge if the IDA of this selected region is larger than its GDA in procedure 106.

Figure 2B:
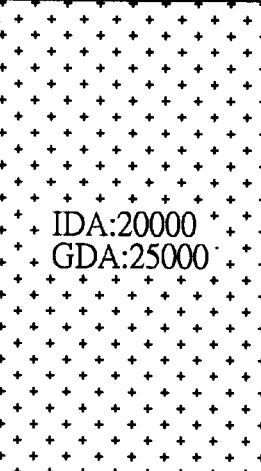

If the IDA of the selected region is larger than its GDA, then the method 1 proceeds to procedure 107 to merge the selected region with its neighboring to-be-processed region to obtain a merged region. Referring to FIG. 2(B), for example, if the upper-left region of the layout shown in FIG. 2(A) is chosen as a selected region, since its IDA (10,000 bytes) is larger than its GDA (5,000 bytes), procedure 107 will try to merge this selected region with its neighboring to-be-processed regions. FIG. 2(B) shows the result of merging this selected region with its underneath to-be-processed region, i.e., the to-be-processed region below the selected region. The IDA of the merged region becomes 20,000 bytes and the GDA of the same becomes 25,000 bytes. After merging, procedure 108 sets the merged region as a new selected region, and the method 1 goes back to procedure 106 to judge if the IDA of this new selected region is still larger than its GDA.

If the IDA of the selected region is smaller than its GDA, then the method 1 proceeds to procedure 109 to set the selected region as a subdivision. For example, since the IDA of the merged region is smaller than the GDA of the same, this merged region will be set as a subdivision in procedure 109. Once a region is set to be a subdivision, it will not be set as a selected region or a to-be-processed region again unless the layout is modified, the threshold value is changed, or the procedure flow of method 1 is started all over again from procedure 101.

Figure 2C:
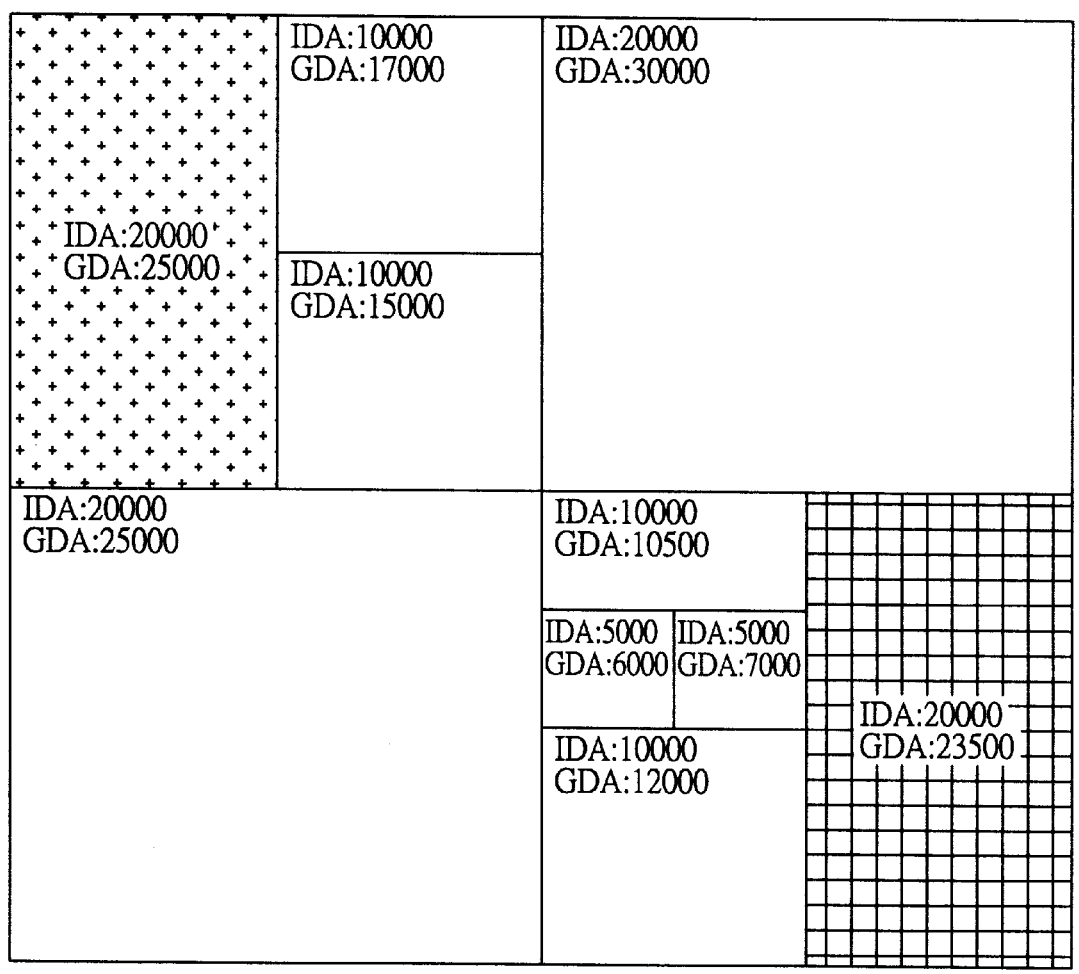

Referring to FIG. 2(C), after repeating procedure 104 to procedure 109, all regions of the layout 200 will become subdivisions. Since the IDA of a subdivision is larger than the GDA of the same, method 1 ensures the network transmission efficiency. That is, the method 1 ensures that the image data transmitted always represents the geometric data that has larger data amount.

It should be noted that those skilled in the art may make modifications or variations without departing from the spirit and scope of the invention. For example, the sequence of procedure 102 and procedure 103 can be exchanged. Another example is that the procedure 105 may select the to-be-processed region the IDA of which is larger than GDA directly, and ignore the to-be-processed region the IDA of which is smaller than GDA to increase processing efficiency.

The method for subdividing data of a layout according to the invention may be implemented in any computer system. Such computer system includes a CPU, a computer-readable storage device, a network-connection module and other necessary peripherals. After the CPU reads and executes the instructions in the program modules, the procedures can be realized by the computer system. The data required can be stored in the storage device or other computer-readable storage medium.

Therefore, although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method for subdividing data of a layout, the layout having a plurality of entities, the method comprising:
   (a) dividing the layout into a plurality of to-be-processed regions, the number of entities of each to-be-processed region being smaller then a predetermined number;
   (b) calculating an image data amount (IDA) of each to-be-processed region;
   (c) calculating a geometry data amount (GDA) of the entities of each to-be-processed region;
   (d) selecting a to-be-processed region from the plurality of to-be-processed regions as a selected region when there exists any to-be-processed region;
   (e) comparing the image data amount of the selected region with the geometry data amount of the selected region;
   (f) when the image data amount of the selected region is larger than the geometry data amount of the selected region, merging the selected region with its neighboring to-be-processed region to obtain a merged region and setting the merged result as a selected region; and
   (g) when the image data amount of the selected region is smaller than the geometry data amount of the selected region, setting the selected region as a subdivision of the layout.

2. The method as recited in claim 1, wherein:
   in the procedure (d), when there exists any to-be-processed region, further judging whether the IDA of the selected to-be-processed region is larger than the GDA of the same, and setting the selected to-be-processed regions as a selected region when the IDA of the selected to-be-processed region is larger than the GDA of the same.

3. The method as recited in claim 1, wherein:
   in the procedure (a), the layout is divided using quad-tree algorithm.

4. The method as recited in claim 1, wherein:
   the layout is an IC layout.

5. The method as recited in claim 1, wherein:
   the layout is a PCB layout.

6. The method as recited in claim 1, wherein:
   the layout is a mask pattern layout.

7. A computer system for subdividing data of a layout, the layout having a plurality of entities, the system comprising:
   (a) means for dividing the layout into a plurality of to-be-processed regions, the number of entities of each to-be-processed region being smaller then a predetermined number;
   (b) means for calculating an image data amount (IDA) of each to-be-processed region;
   (c) means for calculating a geometry data amount (GDA) of the entities of each to-be-processed region;
   (d) means for selecting a to-be-processed region from the plurality of to-be-processed regions as a selected region when there exists any to-be-processed region;

(e) means for comparing the image data amount of the selected region with the geometry data amount of the selected region;

(f) means for merging the selected region with its neighboring to-be-processed region to obtain a merged region and set the merged result as a selected region when the image data amount of the selected region is larger than the geometry data amount of the selected region,; and (g) means for setting the selected region as a subdivision of the layout when the image data amount of the selected region is smaller than the geometry data amount of the selected region.

8. The computer system as recited in claim 7, wherein:

when there exists any to-be-processed region, the means for selecting a to-be-processed region further judging whether the IDA of the selected to-be-processed region is larger than the GDA of the same, and setting the selected to-be-processed regions as a selected region when IDA of the selected to-be-processed region is larger than the GDA of the same.

9. The computer system as recited in claim 7, wherein:

the layout is divided using quad-tree algorithm.

10. The computer system as recited in claim 7, wherein:

the layout is an IC layout.

11. The method as recited in claim 7, wherein:

the layout is a PCB layout.

12. The method as recited in claim 7, wherein:

the layout is a mask pattern layout.

* * * * *